HIGH-FIDELITY WIDE-BAND AMPLIFIER

Filed Sept. 22, 1954 3 Sheets-Sheet 1

HIGH-FIDELITY WIDE-BAND AMPLIFIER

Filed Sept. 22, 1954 3 Sheets-Sheet 3

United States Patent Office 2,934,709

Patented Apr. 26, 1960

2,934,709

HIGH-FIDELITY WIDE-BAND AMPLIFIER

Albert J. Williams, Jr., Philadelphia, Pa., assignor to Leeds and Northrup Company, Philadelphia, Pa., a corporation of Pennsylvania Application September 22, 1954, Serial No. 457,733

10 Claims. (Cl. 330—9)

This invention relates to wide band amplifiers and amplifying systems and more particularly to a high-fidelity wide-band amplifier system for reproducing a range of frequencies extending downward without limit and has for an object the enhancement of the signal-to-noise ratio of the amplifier system.

The art of measurement and control has made ever increasing use of the electronic amplifier to raise minute signals to a level of usefulness. In many applications the amplifiers preferably employed have been and are of the direct-coupled type in order to amplify the direct-current component of the signals produced by low level signal generating devices while providing the system with the excellent high-frequency response of amplifiers of this type. As demands for greater accuracy and faster operation have been made upon equipment, the sensitivity of the amplifiers has been increased.

The attempt to increase the sensitivity of the system to the point where it will respond to a signal of 1 or 2 microvolts to produce in its output a signal of about 1 volt has met with the problem of spurious noise introduced by the components of the amplifier. This noise signal is of sufficient magnitude to vitiate any attempt to obtain satisfactory operation at the desired low levels. One such source of noise is cathode flicker produced by random emission of electrons from the cathode of a vacuum tube. For most practical purposes the cathode flicker may be considered as produced in the first or input stage of a multi-stage vacuum tube amplifier. The cathode flicker noise of the input stage assumes significance particularly in direct-coupled amplifiers, where signals including low frequencies are applied, because the magnitude of its low-frequency components is greater than the magnitude of its higher frequency components. Therefore, input signals of low level and low frequency are extensively masked by the corresponding low-frequency components of cathode flicker noise so as to prevent their use as control signals and to prevent their accurate measurement.

The present invention in one aspect avoids the limitation placed upon the sensitivity of amplifiers by substituting for or placing in advance of the first stage of amplification of a direct-coupled or conductively-coupled amplifier a noise-free signal multiplying means such as a transformer. With such an arrangement a low level signal is stepped up by the transformer to a magnitude where the cathode flicker noise, introduced by the first stage of the electronic amplifier, will be insignificant as compared to the applied stepped-up input signal.

In many applications of amplifiers, for example, in analog computers and in automatic-balancing control and measuring systems, it is desirable that they be of the fast-acting type. In other words, it is desirable that the amplifier be of the wide-band type reproducing with high fidelity the characteristic of the input signal. Accordingly, it is another object of the present invention to provide a high-fidelity and fast-acting amplifier.

In carrying out the objects of the present invention, there is provided in the input of a direct-coupled or conductively-coupled amplifier a transformer for increasing the magnitude of the alternating-current or A.-C. component of an input signal applied to a first input of the direct-coupled amplifier. A D.-C. component representative of the direct-current or D.-C. component of the input signal is applied to a second input of the direct-coupled amplifier at a high impedance point at or beyond the secondary side of the transformer. The A.-C. and D.-C. components of the input signal, thus introduced into the conductively-coupled amplifier at a level much greater than the level of amplifier-generated noise, are combined to produce in the output of the direct-coupled amplifier a high fidelity reproduction of the input signal.

More particularly in one embodiment of the present invention there is provided in a wide-band amplifier system for amplifying electric signals over a wide frequency band extending downward without limit a means for increasing the signal-to-noise ratio of the amplifier system and thereby reducing the effect of cathode flicker noise and other noise generated by the amplifier system. The amplifier system includes a direct-coupled amplifier in the input of which a signal multipying transformer is connected. The transformer, a part of the signal-to-noise ratio increasing means of the system, transmits and steps up all A.-C. components of the input signal. The equivalent of the D.-C. component is injected into the direct-coupled amplifier by a means, including an integrator, which compares the input signal applied to the amplifier system with a selected fraction of the output signal of the system which fraction is the output signal of the system divided by the prescribed gain of the system.

The gain of the direct-coupled amplifier is stabilized through the provision in the amplifier of high gain together with a conductive feedback loop. The inclusion of feedback also enhances the fidelity of the amplifier system by augmenting the physical time constant of the input transformer in its associated circuit thus reducing the rate-of-decay characteristic thereof to reduce the extent of correction required of the integrator immediately following a change in the D.-C. level of the input signal over any increment of time.

The fidelity of the system is also improved by a compensatory network, which may be used in conjunction with the augmented time constant technique, producing an anticipatory signal in advance of the initiation of decay in the output of the transformer. The anticipatory signal is applied to the input of the integrator to produce an output signal which is immediately added to the output of the transformer to construct in the direct-coupled amplifier a total signal very closely matchnig the characteristic of the input signal.

The present application is a continuation-in-part of my copending application Serial No. 252,433, filed October 22, 1951, as a continuation-in-part of my parent application Serial No. 82,302, filed March 19, 1949, and abandoned in favor of my application Serial No. 252,433, now Patent 2,919,409.

Other objects and advantages of the present invention will become better understood from the following detailed description taken in conjunction with the accompanying drawings, in which.

Figure 1:
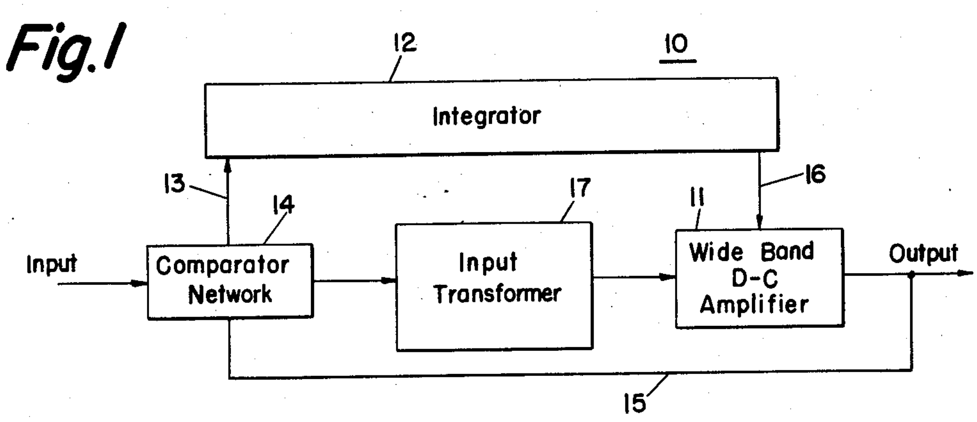
Fig. 1 is a block schematic of an amplifier system embodying the present invention.

Referring now to the drawings, and more particularly to Fig. 1, there is illustrated in block schematic form an amplifier system 10 which in embodying the present invention has the quality of reproduction with high fidelity of low level input signals over a range of frequencies extending downward without limit.

The amplifier system of the present invention is similar in arrangement and operation to the wide-band D.-C. amplifier of my copending application Serial No. 252,433, filed October 22, 1951, in which zero-drift inherent in D.-C. coupled amplifiers is compensated for. Briefly such a system includes a direct-coupled amplifier 11. As is well known, direct-coupled amplifiers inherently produce spurious signals causing zero-drift. In correction of the zero-drift, an integrator 12 is provided. The integrator 12 receives as by line 13 in its input a signal from a comparator network 14 which compares the input signal to the system with the output signal of the system, derived by feedback loop 15, divided by the prescribed gain of the amplifier system 10 and produces a signal equal to the difference between the two compared signals and thus representative of zero-drift. The compensatory signal is then introduced into an input of the direct-coupled amplifier 11 as by line 16 to produce in the output of the amplifier a more faithful reproduction of the input signal.

The magnitude of the compensatory signal will remain constant for all values of input signal, changing only when there arises a further deviation in the difference between the input signal and the output signal divided by the prescribed gain of the system.

The above described system together with other types of direct-coupled amplifiers are subject to a limitation as to the minimum value of input signal which can be satisfactorily reproduced so that the signal may be measured or used for control purposes. This limitation is brought about by the inherent presence in any vacuum tube of cathode-flicker noise.

The cathode-flicker noise is of particular importance in direct-coupled amplifier systems where the applied input signal is of low level and includes components of very low frequency. Cathode-flicker noise may be said to include a fairly wide frequency spectrum. While the high-frequency components of the noise are of insignificant magnitudes, the magnitudes of the low-frequency components of the noise are sufficiently high to completely mask the low level, low-frequency components of an applied signal. The combination of low-level signals and the large magnitude of the low-frequency components of the noise contribute to an undesirably low signal-to-noise ratio for the amplifier system. Those skilled in the art have suggested that the inverse relationship between the magnitude of cathode-flicker noise and frequency may be represented by the expression:

$$\Delta Ic^2 = \frac{Ic^2}{\omega^2 + a^2} \qquad (1)$$

where $Ic$=cathode current
$\omega = 2\pi f$, where $f$ is frequency
$a$=a constant; and
$\Delta Ic^2$=mean square fluctuation of the cathode current due to cathode flicker effect For an extended discussion of Equation 1, reference may be made to the March 1954 issue of "Electronic Engineering" at pages 116 and 117.

Heretofore the signal-to-noise ratio of the amplifier has been improved somewhat by operations upon the amplifier stages themselves. More recently an attempt has been made to reduce the effect of cathode-flicker noise through use of a "cascade" type input. Such an arrangement has been suggested at pages 156–157 of the March 1954 issue of "Electronics." In this invention, however, I propose to increase the signal-to-noise ratio by swamping out the cathode-flicker noise through voltage step-up of the input signal before it is applied to the first electronic stage of a direct-coupled amplifier.

Figure 3:
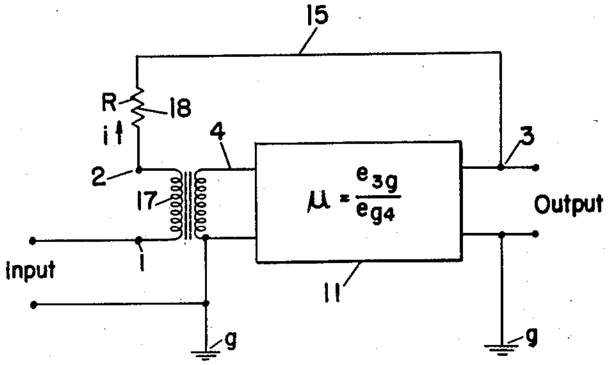
Fig. 3 is a simplified block and circuit schematic useful in the derivation of expressions for circuit relations embodied in the present invention.

In accordance with the present invention, the limitation heretofore present in direct-coupled amplifier systems is obviated by adding a signal multiplying means which is devoid of noise-producing characteristics. Such a means is illustrated, Fig. 3, as including an input transformer 17 which is connected to a first input of the wide-band direct-coupled amplifier 11. Although shown to be of the isolating type, the transformer 17, as hereinafter more specifically described, may be of the auto-transformer type. By providing the transformer 17 with adequate voltage step-up of approximately 10 or more, the input signal, which may be as low as 1 or 2 microvolts, is raised to a value high enough so that the relative magnitude of noise signal produced by cathode-flicker becomes small. In other words, the signal-to-noise ratio of the amplifier system is improved as by a factor of 10. As the magnitude of the input signal is increased above 2 microvolts, the effect of the cathode-flicker becomes inconsequential.

In the embodiment illustrated, only the stepped-up alternating-current component of the input signal is applied to the input of the amplifier 11. The direct-current component of the input signal, in a manner to be described, is effectively separated by the transformer from the first input stage of the direct-coupled amplifier and introduced, in amplified form, into the amplifier 11 at a high-impedance second input to the secondary side of the transformer 17. However, for a better understanding of the invention, the amplifier system 10 will initially be considered as comprised of the transformer 17 and the direct-coupled amplifier 11. Now assuming that the input signal includes a wide range of frequencies, including zero-frequency, and for that matter let us, for the discussion to follow, assume the most difficult waveform to reproduce, a step-function such as illustrated by the curve D of Fig. 2, then the amplifier system may accurately reproduce the leading slope of the signal waveform. However, the output of the amplifier system, in the absence of the feedback path 15 and the forward path through integrator 12, upon the signal reaching its peak or inflection point will begin to decay at a rate determined by the physical time constant of the transformer 17 in its associated circuit. This phenomena is illustrated graphically by curve A which represents the output of a system consisting of the wide-band direct-coupled amplifier 11 having in its input the transformer 17 whose physical time constant is $$\tau = \frac{L}{R} \qquad (1A)$$

where

L is the inductance of the transformer, and

R is equivalent to the resistance of the transformer and associated circuit resistance.

Transformers having a physical time constant of 0.16 second are readily obtainable. However, as illustrated by curve A, the time constant being shown as a line drawn tangential to curve A, at its point of inflection, the resultant output of the direct-coupled amplifier 11 is not even remotely a representation of the character of the input step function, which, as aforesaid, is illustrated by curve D.

The output characteristic of the direct-coupled amplifier may be improved considerably by increasing by a large amount the time constant of the transformer so that the rate of decay of the output signal is reduced. The increase in the transformer time constant may be accomplished by designing and constructing a special transformer with a physical time constant of desired magnitude. However, the cost of a transformer having a time constant in the range of from 16 to 160 seconds is prohibitive. However, the time constant of the transformer may be augmented by providing in a direct-coupled amplifier the feedback loop 15 and increasing the loop gain of the amplifier to thereby increase or augment the time constant of the transformer. Thus, by providing the amplifier with the feedback loop the effective time constant of the transformer is no longer $$\frac{L}{R}$$

but rather takes on an augmented form:

$$\tau=\frac{L}{R}(1+\mu) \qquad (2)$$

where:

$\mu$ is the voltage gain of the amplifier 11.

The characteristic output curve of the D.-C. amplifier having the transformer of augmented time constant in its input takes the shape of curve B. A full explanation and derivation of the new term for the time constant of the transformer will appear in detail hereinafter.

Although the output characteristic and the fidelity of the D.-C. amplifier is materially improved with the provision of the augmented time constant, it is still relatively far removed from the absolute fidelity required in amplifiers which are to be applied to use in computers, control systems and the like. The desired end in reproduction fidelity is the reproduction in the output of the step function of curve D. It is closely approached, the deviation for practical purposes being negligible, by including in the system the integrator 12 which may be of any well known type, either step or continuous, but preferably of the continuous type specifically set forth hereinafter and also illustrated and described in my aforesaid copending application Serial No. 252,433.

The combination of the direct-coupled amplifier 11 with the integrator 12 and the transformer 17 having the augmented time constant $$\frac{L}{R}(1+\mu)$$

has a characteristic of output represented by curve C, which is illustrated in part as a dotted line and in part as a solid line. As shown, there is a slight dip in the output of the amplifier immediately after the step function has reached its inflection point. The slight dip may be removed or otherwise made insignificant to produce in the output the waveform of curve D by either providing in the input of the integrator a compensating network or alternatively by increasing the loop gain of the amplifier system.

It will be recalled that the combination of a simple direct-coupled amplifier with a transformer in its input having a physical time constant $$\frac{L}{R}$$

has an output in response to a step function which closely resembles the characteristic illustrated by curve A. The explanation of how the addition of a feedback circuit and increased gain or loop gain will enhance the physical time constant of the transformer so that the new amplifier system has an output in response to a step function which closely resembles the characteristic illustrated by curve B will now be undertaken. For this analysis, reference is made to a simplified block and circuit schematic of an amplifier system illustrated in Fig. 3 of the drawings.

The amplifier 11 is shown having the transformer 17 in its input and the feedback circuit 15 is connected between the output of the amplifier and in series with the primary of the transformer. A resistor 18 having a value of resistance R is illustrated to represent all of the resistance in the primary circuit of the transformer 17. Other assumptions which are made in connection with the derivation which follows are:

The transformer has:

A 1 to 1 turns ratio, perfect coupling (no leakage); and

A primary inductance L (no internal resistance) other than shown in R).

The amplifier system is possessed of unity feedback. Applying Kirchhoff's Law to the mesh $g$, 1, 2, 3, $g$:

$$e_{1g}+e_{21}+e_{32}+e_{g3}=0 \qquad (3)$$

$$e_{12}=e_{g4}=\frac{di}{dt}L \qquad (4)$$

$$e_{3g}=e_{g4}\mu=\frac{di}{dt}L\mu \qquad (5)$$

where $\mu$ is the voltage gain of the amplifier 11.

$$e_{32}=-iR \qquad (6)$$

where R is the resistance of resistor 18, and $i$ is the current in the feedback loop.

Substituting the relationship of Equations 5 and 6 into Equation 3

$$e_{1g}-\frac{di}{dt}L-iR-\frac{di}{dt}L\mu=0 \qquad (7)$$

$$e_{1g}=iR+\frac{di}{dt}L(1+\mu) \qquad (8)$$

With a step function as the input signal, designated $e_{s1g}$, the differential Equation 8 gives $$i=\frac{e_{s1g}}{R}\left(1-\epsilon^{\frac{-t}{\tau}}\right) \qquad (9)$$

where $e_{s1g}$ is a step voltage of magnitude $e$ with voltage point 1 positive with respect to ground;

$t$ is time;

$\tau$ is the time constant; and $\epsilon$=base of Napierian logarithms

The time constant $\tau$ takes on an augmented value determined by the product of the physical time constant $$\frac{L}{R}$$

of the transformer and the quantity $(1+\mu)$ or:

$$\tau=\frac{L}{R}(1+\mu) \qquad (10)$$

With the feedback other than unity and the transformer turns ratio other than 1 to 1, then Equation 10 may be written as $$\tau=\frac{L}{R}(1+n\mu\beta) \qquad (11)$$

where $n$ is the turns ratio of the transformer; and $\beta$ is the feed-back factor.

Again assuming unity feedback and a unity transformer turns ratio, then by differentiating the relationship of Equation 9 and applying it to Equation 4, the characteristic of the output signal $e_{3g}$ of the amplifier in response to the step function input signal $e_{s1g}$ can be determined mathematically as follows:

$$e_{12}=\left\{\frac{e_{s1g}}{R}\frac{1}{\tau}\epsilon^{-\frac{t}{\tau}}\right\}L \qquad (12)$$

which may be rewritten, by applying the relationship of Equation 10, as $$e_{12}=\frac{e_{sig}}{(1+\mu)}\epsilon^{-\frac{t}{\frac{L}{R}(1+\mu)}} \quad (13)$$

Since the transformer has a 1 to 1 turns ratio $$e_{3g}=\mu e_{g4}=\mu e_{12}$$

Therefore, $$e_{3g}=e_{sig}\frac{\mu}{1+\mu}\epsilon^{-\frac{t}{\frac{L}{R}(1+\mu)}} \quad (14)$$

From Equation 14 may be determined the fact that the output signal $e_{3g}$ of the amplifier will decay to zero in response to an input signal $e_{sig}$ which has been defined as a step function. However, the time constant $\tau$ may be extended beyond the physical time constant of the transformer, and hence the rate of decay will be materially reduced, by increasing the voltage gain $\mu$ (mu) of the amplifier or by increasing the loop gain $\mu\beta$.

Figure 4:
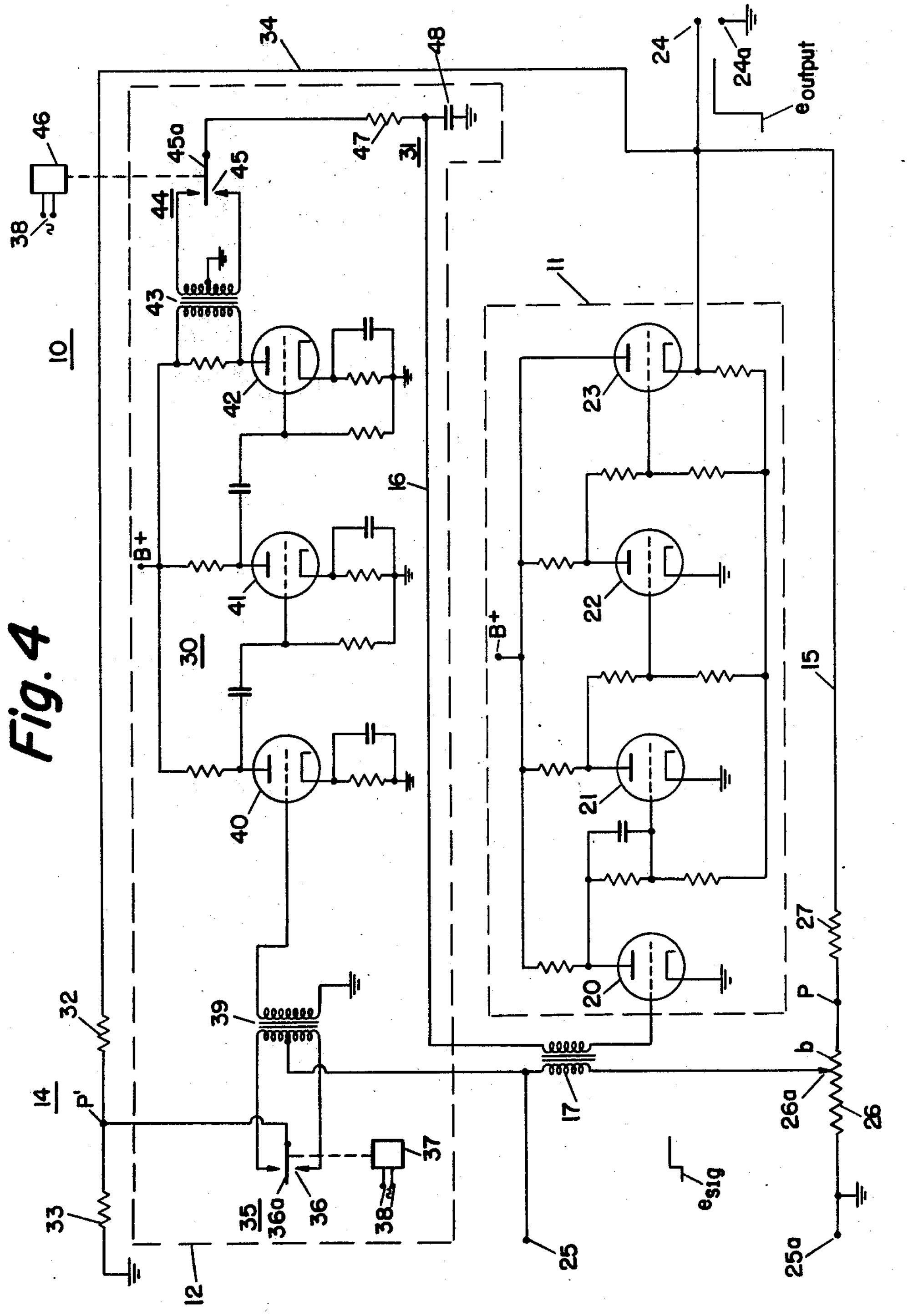
Fig. 4 is a circuit schematic of an amplifier system embodying a preferred form of the present invention.

A preferred embodiment of the present invention is schematically illustrated in Fig. 4 in which the wide-band amplifier system 10 has an input circuit to which there may be applied a system input signal, as at input terminals 25 and **25*a*, for producing in an output circuit, as at output terminals 24 and 24*a*, an amplified system output signal. The amplifier system 10 includes an integrator 12 having as a part thereof an amplifier of the chopper or non-conductively coupled type and including amplifying tubes 40, 41 and 42. The system also includes the direct-coupled amplifier 11 comprising a plurality of direct-coupled stages 20–23. The number of stages will, of course, depend upon the magnitude of amplification required of the amplifier itself. The various stages 20–23 shown, each comprising individual vacuum tube envelopes, may in fact be comprised of dual triodes. In order to assure the correct use of the feedback, it is important that the number of stages and their arrangement provide an output signal of proper phase with regard to the input signal to the amplifier. In the arrangement illustrated, the proper phasing of the output signal is obtained through the use of the signal-to-noise-ratio enhancing transformer 17, three electronic stages of voltage amplification 20–22 and a cathode follower 23**, which is the output stage of the amplifier. By terminating the amplifier in a cathode-follower stage, the connection from the output of the amplifier to a measuring or control instrument (not shown), into which the information from the amplifier is fed, may be remote.

The step-up or signal-multiplying transformer 17, in the first input of the amplifier 11 and shown to be of the isolating type, is present to raise the level of signal applied to the first stage 20 of the amplifier and thus, by improving its signal-to-noise-ratio, makes it suitable for low level use. In this regard it will be recalled that reference has earlier been made to the fact that the degree of usefulness of amplifiers for low level application is limited by the presence, particularly troublesome in the first stage and at signals of low frequency, of cathode flicker noise. The desirable feature of the transformer 17 is its ability to step up the voltage level of signals without introducing spurious noise. Accordingly, the low-level signal, illustrated schematically as a step function $e_{sig}$, applied to input terminals 25, **25*a*, and across the primary of the transformer 17 will be raised from a very low level, of the order of one or two microvolts, to appear across the secondary of the transformer as a signal of magnitude from 10 to 20 microvolts. A step-up factor or a voltage multiplier of 10 for the transformer 17 has been found adequate to raise the low-level signal to a value which effectively swamps out the spurious cathode flicker noise signal produced by the first electronic stage 20 of the amplifier 11**.

Depending, of course, upon the magnitude of the cathode flicker signal, the step-up of the transformer 17 may be varied. Such change in transformer step-up may be effected by change in its turns ratio which may be accomplished by original design or by provision of a multi-tapped primary or secondary, or both.

The zero frequency or direct-current component of the input signal, as aforesaid, is diverted from the input of the direct-coupled amplifier 11 by the isolating transformer 17, and is detected and introduced at a raised level in compensatory manner into the second input of the direct-coupled amplifier 11 on the secondary side of the transformer by the integrator 12. As a result of the action of the integrator 12, of which the non-conductively coupled amplifier forms a part, the output signal of the amplifier schematically illustrated as $e_{output}$ adjacent the output terminals 24, **24*a***, is possessed of the same waveform or characteristics as that of the input signal, $e_{sig}$, thus illustrating high-fidelity reproduction.

Another prerequisite of fidelity is that the system be gain-stabilized. In such a system, the overall gain may be expressed as $$\frac{1}{\frac{1}{\mu}-\beta}$$

It can be seen that when the $\mu\beta$ product is made large that the overall gain is made relatively independent of variations in $\mu$.

In the embodiment illustrated in Fig. 4, the amplifier 11 has its own negative feedback means formed by a loop including resistors 26 and 27. The values of resistors 26 and 27 are selected in a ratio such that $$\frac{R26+R27}{R26}=\frac{R}{r}=\mu t \quad (15)$$

Where $R26$=resistance of resistor 26
$R27$=resistance of resistor 27
$R$=total resistance of the feedback circuit
$r$=selected fraction of the feedback resistance
$\mu t$=prescribed gain of the amplifier system When the magnitude of the applied input signal is equalled by the selected fraction of the output signal, i.e., the output signal divided by the prescribed overall gain of the amplifier, the potential at voltage point P equals the magnitude of the input signal and the voltage drop across the input to the transformer becomes substantially zero. The arrangement disclosed thus reduces the current drain from the source of voltage to be measured by raising the potential at voltage point P. Since the amplifier 11 is possessed of only finite gain, it is necessary that the ratio of the feedback resistors, constituting a resistive voltage divider, be modified by a predetermined extent so that the amplifier will respond in full measure to a step function signal placed upon its input. For this purpose, the resistor 26 is shown as having an adjustable contact **26*a*** which has been moved a distance equivalent to a resistance value $b$. The value of $b$ necessary to maintain the overall gain at $$\frac{R}{r}$$

is represented by the expression:

$$b=\frac{R}{n\mu} \quad (16)$$

Where $\mu$ is the voltage gain of the amplifier; and
$n$ is the turns ratio of the transformer.

An inspection of Equation 16 will reveal that the value $b$ will depend upon the magnitude of the overall resistance R in the feedback circuit. For one system having a transformer step-up ($n$) of 10, an amplifier gain ($\mu$) of 1,000 and a feedback resistance (R) of 10,000 ohms, $b$ was set at 1 ohm.

It will be recalled that the compensatory signal produced by the integrator 12 is derived by comparing the input signal to a selected fraction of the output signal, which selected fraction is the output signal divided by the prescribed gain of the amplifier system 10. In many respects the integrator 12 functions in a manner similar to the circuitry of the invention disclosed in my aforesaid copending application Serial No. 242,433, for in addition to providing a corrective signal compensating for the signal lost in the isolating transformer 17, the integrator also corrects the direct-coupled amplifier 11 for zero drift, i.e., the signal produced in the output of a direct-coupled amplifier, with zero signal on its input, due to spurious signals developed within the direct coupled amplifier itself. For a more complete understanding of zero drift, its product and modes of correcting for the same, reference may be had to my aforesaid copending application.

The integrator 12, shown to be of the continuous type, includes a high-gain A.C. or non-conductively-coupled amplifier 30 of the chopper type having drift-free characteristics and an integrator network 31 in its output. The signal applied to the input of the integrator 12 is derived from the comparator network 14. The comparator network or circuit 14 is in effect a voltage-divider made up of resistors 32 and 33 connected in series with lead 34 which is connected between the output terminal 24 and ground. The resistors are of value predetermined to meet a ratio equal to the prescribed gain of the amplifier system, earlier expressed as:

$$\mu t=\frac{R}{r} \tag{17}$$

where $R=R_{32}+R_{33}$
$r=R_{33}$

Accordingly, the potential at voltage point P′ is in part representative of a selected fraction of the amplifier system output at terminal 24.

The input signal at input terminal 25 is compared with the potential or signal at voltage point P′ by a circuit including the primary winding of transformer 39 and the contact arm 36a of switch 36. The difference between these signals is the input to integrator 12 and represents the deviation of the D.C. component of the system output signal from a true reproduction of the D.C. component of the applied signal caused by drift of the direct-coupled amplifier 11 and by the diversion by transformer 17 of the D.C. component of the applied signal. This deviation or difference signal will be comprised substantially of D.C. voltage inasmuch as the transformer 17 has passed all alternating-current components of the input signal which also appear in the signal fed back to voltage point P′ and are there cancelled out by the alternating-current component of the input signal applied to terminal 25. Therefore, the deviation signal must be converted to alternating-current voltage in order to pass through the A.C. amplifier 30.

The transition from D.C. to A.C. is effected by a contact modulator of a converter arrangement 35 including a single-pole, double-throw switch 36 having a vibrating contact arm 36a driven by a mechanical relay or any other suitable mechanical means such as operating coil 37 producing an oscillatory or vibratory movement. The operating coil 37 derives its power from an alternating-current supply schematically represented by terminals 38 and is driven at a rate determined in part by the frequency of the alternating-current supply, for example, 60 cycles per second. If the relay 37 is of the polarized type, the contact arm 36 will be vibrated at 60 cycles per second. On the other hand, if the relay is not of the polarized type, the contact arm 36a will be vibrated at a double rate or at 120 cycles per second.

The contacts of the converter 35 are serially connected with the center-tapped primary of a signal step-up transformer 39 whose secondary is connected across the input of a first stage 40 of the non-conductively coupled amplifier 30.

Subsequent amplification of the signal as by stages 41 and 42 and by transformer 43 raises its magnitude to a desired level. The signal is subsequently demodulated or reconverted to direct current by way of a synchronous rectifier comprising a contact modulator arrangement 44 similar to and operating in synchronism with the contact modulator 35 in the input of the chopper amplifier. The synchronous rectifier arrangement 44 includes the transformer 43 whose secondary is center-tapped and whose ends terminate in the contacts of a single-pole, double-throw switch 45 having a vibrating reed or contact arm 45a driven in oscillatory manner by an operating coil 46 which is of the same type as coil 37 and deriving its power from the same alternating-current source, here again generically represented by terminals 38.

The output signal of the chopper amplifier which has now been returned to a direct-current form but greatly increased in magnitude, is integrated by the network 31 comprising resistor 47 and capacitor 48. A corrective signal, derived from across the charged capacity 48 by way of a circuit including conductor 16 and the serially-connected secondary of transformer 17, is fed into the input of the first amplifier stage 20 of the direct-coupled amplifier 11. Though the compensating or correcting signal is shown as fed by way of the secondary of transformer 17 into the amplifier 11, it is to be understood that this signal may be fed into the amplifier at any point beyond the secondary of the transformer 17.

The capacitor 48 will continue to supply a signal to the direct-coupled amplifier so to maintain its output. For this purpose the time constant of the integrator is made very large so to prolong the effective charge on the capacitor. A satisfactory time constant of 10,000 seconds may be obtained by assigning a value of 100 megohms to resistor 47 and a value of 100 microfarads to capacitor 48. Values of the order indicated are preferred since a smaller capacitor and larger resistor may cause the integrator network to be affected by grid current or changes in grid current from the input stage 20 of the amplifier 11.

Since the output of the integrator may have to be maintained at or near 1 volt and since only 1 microvolt may be available at the input, the chopper amplifier should have a voltage gain of 1,000,000. The total gain may be provided by the input and output transformers 39 and 43 in conjunction with the electronic stages 40—42.

Another condition placed upon the integrator is that its delay time which is the time for its output to build up to the value of its input must be less than the time constant of the transformer 17. Actually, because the output of the integrator is fed to the secondary side of transformer 17, which may have a step-up of 10 to 1, the integrator output must be increased to 10 times its input within the time constant of the transformer 17. Assuming the physical time constant to be 0.1 second, it can be readily seen that the integrator network time constant of 10,000 seconds and a voltage gain of 1,000,000 in the chopper amplifier satisfies this condition.

Figure 2:
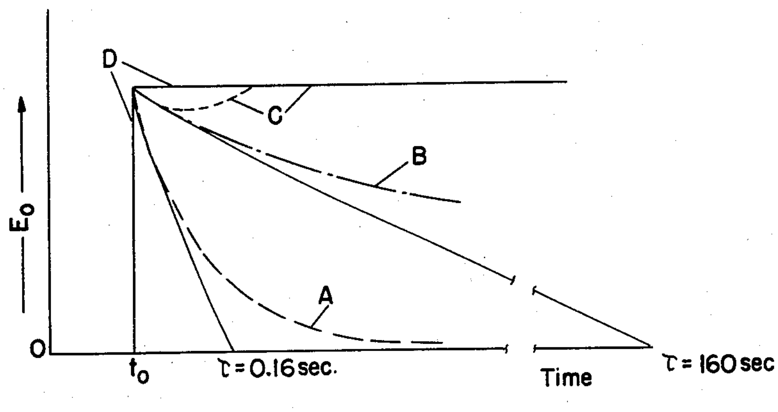
Fig. 2 is a graphical illustration helpful in the understanding of the present invention.

Upon the appearance of a step-change on the input to the amplifier system, the output will respond stepwise in full measure thereafter followed by a dip in the output. This dip will be temporary and thereafter the ultimate response in the output will be in full measure due to the continuing action of the integrator 12 responding to any input thereto no matter how small. The stepwise response in the output will be in full measure because the magnitude of resistance $b$ has been made of a correct value to compensate for the finite value of amplifier gain. The output characteristic will very closely approximate the characteristic curve C (Fig. 2). The dip in curve C has been greatly accentuated and would in practice amount to only a fraction of one percent of the output signal.

The dip following the stepwise response in the output of the amplifier may be compensated for and materially reduced by increasing the loop gain to a fairly high value, for example, 1,000. The increased loop gain has the effect of augmenting the time constant of the input transformer 17 and thereby reducing the rate of decay of the output signal. This fact can be readily seen from the aforederived expression of the enhanced or augmented time constant $$\tau=\frac{L}{R}(1+\mu\beta)$$

where $\mu\beta$ is loop gain of the amplifier.

With a continuous integrator of the type illustrated, a compensating action will start as soon as a difference occurs between the input and the selected fraction of the output of the amplifier. Accordingly, the dip in the output will be reduced almost immediately upon the occurrence of this difference and the output signal will be rapidly returned to a value bearing the prescribed relation to the input. The amount of the dip in the output signal occurring before the integrator has had an opportunity to check it will be materially reduced by the enhanced time constant of the transformer.

The benefits flowing from the augmented time constant are more readily appreciated when the continuous integrator is replaced by a step integrator of the type illustrated in Fig. 4 of my aforementioned copending application, Serial No. 242,433, whose output is changed in the form of a series of spaced steps whose rate is determined by the frequency of operation of the converter. Therefore, to the increment of time delay occurring between the actual change in amplifier output and the signal appearing at the integrator is added the period of delay introduced by the intermittent operation of the step integrator. These time delay periods are additive, and without the benefits of the augmented time constant, the output signal of the D.C. amplifier would drop rapidly and might cause such a reduction in the output signal as to seriously affect and make more difficult the return of the output signal to a prescribed value through integrator action.

With a step-type of integrator, it is important that the period of its operation, which is the reciprocal of the frequency of its chopper or converter, be much less than the augmented time constant of the transformer. It follows, therefore, that the greater the loop gain of the amplifier, and, therefore, the augmented time constant of the transformer, the less will be the fractional dip in the output which immediately follows the initial response of the system to a step input. The desirability of a large augmented time constant in the transformer may be expressed mathematically from the above statement to be $$\text{Fractional dip in output}=\frac{P}{\tau}=\frac{P}{\frac{L}{R_t}\left(1+n\mu\frac{r}{R}\right)} \qquad (18)$$

where $P$=period of the step integrator
$\tau$=augmented time constant of transformer 17

$$\tau=\frac{L}{R_t}\left(1+n\mu\frac{r}{R}\right)$$

Figure 5:
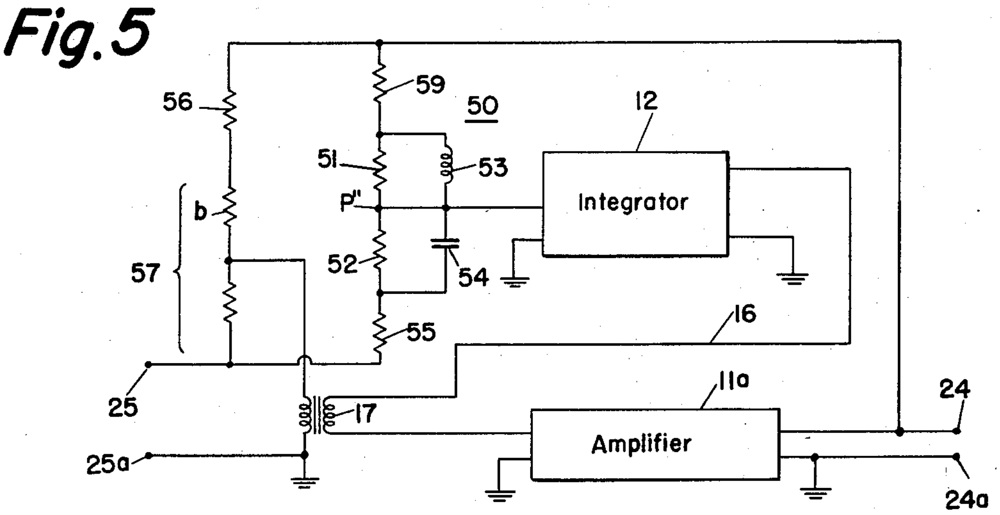
Fig. 5 illustrates a modified form of the present invention.

$\frac{L}{R_t}$=physical time constant of transformer
$L$=inductance of transformer primary
$R_t$=resistance associated with transformer primary
$n$=transformer turns ratio or stepup
$\mu$=amplifier voltage gain (exclusive of transformer 17)
$\frac{r}{R}$=approximate feedback ratio An alternative arrangement compensating for the fractional dip in the output of the amplifier system is illustrated in Fig. 5, where there is provided in the input circuit of the integrator 12 an anticipatory network 50 which produces a corrective signal for the integrator before an actual change occurs between the input signal to the system and the selected fractional part of the output signal. The network in the input of the integrator includes a feedback resistor 59 in series with equal-value resistors 51 and 52 respectively shunted by inductor 53 and capacitor 54, and a resistor 55. With the resistors arranged under steady-state conditions, i.e., so that the prescribed gain of the amplifier system is represented by a ratio:

$$\frac{R_{59}}{R_{55}+R_{52}}=\frac{R}{r} \qquad (19)$$

where $R_{59}$=resistance of resistor 59;
$R_{52}$=resistance of resistor 52=resistance of resistor 51; and
$R_{55}$=resistance of resistor 55, then under continued steady-state conditions voltage point P″ will be at zero potential and the input to the integrator 12 will also be zero. The resistor 51 does not enter into the ratio because under direct-current conditions it is shorted by inductor 53. Now upon the occurrence of a step-change in the input to the amplifier system, there will also be a related change in the output of the amplifier system larger than its input in the ratio of $$\frac{R}{r}=\frac{R_{56}}{R_{57}}=\frac{R_{52}}{R_{55}+R_{52}}$$

The capacitor 54 will act as a short circuit across the resistor 52, thereby causing a difference signal to be placed upon the input of the integrator. This action will occur prior to the actual occurrence of a difference between the input signal to the amplifying system and the output signal of the system divided by the prescribed gain of the system. This difference signal, in a nature anticipatory, will produce a corrective signal in the output of the integrator 12 which will appear in the input to the direct-coupled amplifier in compensatory manner to reduce the fractional dip in the amplifier output normally immediately following the stepwise change in the input signal.

When the input step signal attains the inflection point of the step, the output of the direct-coupled amplifier will appear at the network 50 as a direct-current signal. When steady-state conditions have been reached, the inductance 53 will be an effective short circuit across the resistor 51 and the normal steady-state ratio $$\frac{R_{59}}{R_{55}+R_{52}}$$

of the resistances will be attained. Hence, the inductor 53 and capacitor 54 operate in a manner similar to switches responsive to the character of the input signal to remove and include their associated resistances 51, 52 in the network 50.

The negative feedback circuit for the direct-coupled amplifier 11a includes serially-connected resistors 56 and 57. The primary of the transformer 17 being grounded requires that the feedback voltage be of such phase and magnitude as to bring the ungrounded end of the primary to substantially zero potential when the selected fraction of the output signal equals the magnitude of the input signal.

The direct-coupled amplifier 11a is similar to the direct-coupled amplifier 11 of Fig. 4, except that it contains one more or one less stage of amplification in order to obtain proper phasing between the feedback signal and the input signal. Because the amplifier 11a is possessed of finite gain, it is necessary to connect the ungrounded side of the transformer primary a distance from the interconnection of resistors 56 and 57 to provide a resistance value of *b* ohms. This small shift in the connection assures that the output of the direct-coupled amplifier 11a will respond in full measure to the rapidly changing leading edge of a step function applied to its input. The value of *b* is the same as that assigned to the value *b* used in conjunction with the embodiment of Fig. 4.

An essential relation for fidelity in the embodiment of Fig. 5 is the requirement that the physical time constant of the input transformer 17 be equaled by the time constant of the circuit of inductor 53 and by the time constant of the circuit of capacitor 54. These relationships set forth mathematically are:

$$T=R_{52}C_{54}=\frac{L_{53}}{R_{51}}=\frac{L}{\frac{(R_{57}-b)(R_{56}+b)}{R_{56}+R_{57}}} \qquad (20)$$

where $R_{52}$=resistance of resistor 52
$C_{54}$=capacitance of capacitor 54
$L_{53}$=inductance of inductor 53
$R_{51}$=resistance of resistor 51
$L$=inductance of the primary of transformer 17
$R_{56}$=resistance of resistor 56
$R_{57}$=resistance of resistor 57
$b$=value of resistance to compensate for finite gain of the amplifier 11

The fidelity of the system of Fig. 5 is improved over that of Fig. 4. However, for all practical purposes the method of compensation associated with Fig. 4, i.e., increased loop gain, is adequate to provide an amplifier of sufficient fidelity for use at low levels.

Up to this point the input transformer 17 of the various arrangements has been shown and described as being of the isolating type. It is to be understood that if a discriminate grounding of the amplifier system is effected, the isolation type transformer may be substituted for by an autotransformer. The integrator output could best be inserted on the grid of a differential amplifier as shown in my aforementioned copending application.

Figure 6:
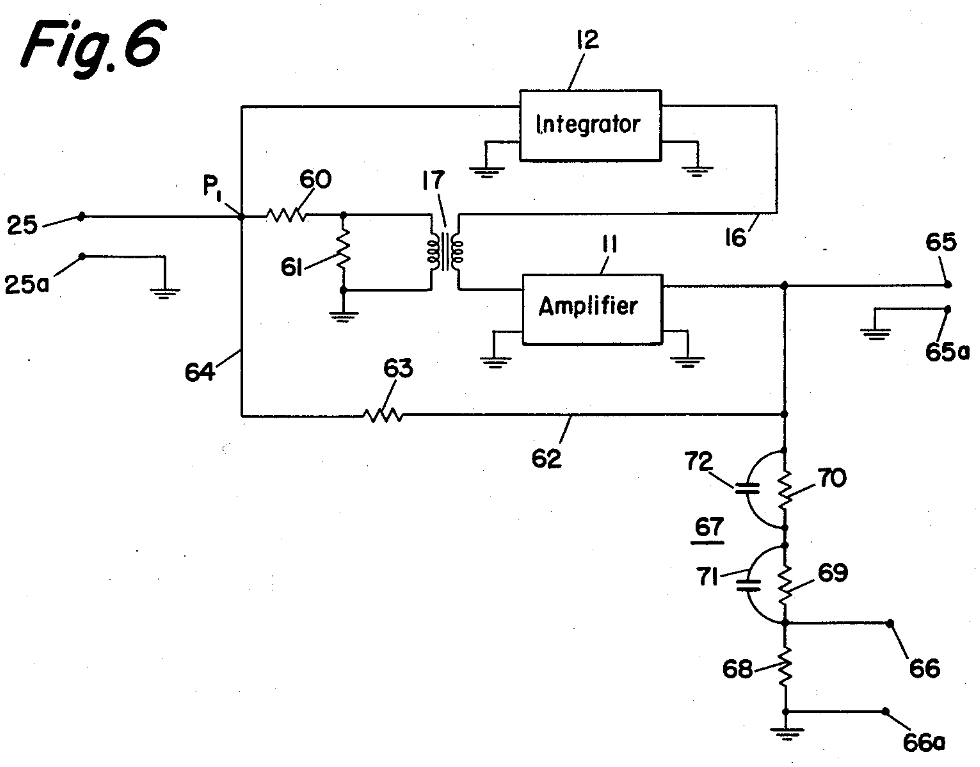
Fig. 6 illustrates yet another modification of the present invention.

The amplifier system of Fig. 6 is suited for photoelectric work, polarography and similar measurements where it is desirable to measure current rather than voltage. A step-up transformer 17 is again included as a first stage in a direct-coupled amplifier to improve the signal-to-noise ratio. As is well known, a pure inductance will act as a short circuit when direct current is applied thereto. Although the primary of transformer 17 is not a pure inductance, its resistance is relatively low; therefore, a series resistor 60 is added in series with the primary winding of transformer 17 to avoid extensive shunting of the integrator input. The physical time constant of the transformer 17 is materially increased by the addition in shunt with the primary thereof of resistor 61.

A common current-comparator arrangement is provided for both D.C. amplifier 11 and the integrator 12 including a feedback loop extending from the output of the amplifier 11 by way of a circuit including conductor 62, feedback resistor 63 and conductor 64. The comparator arrangement operates in manner like that in the foregoing described arrangements operating in conjunction with voltage measurement in that the output of the D.C. amplifier 11 is divided by the prescribed gain of the amplifier system 10, and this selected fraction of the output is compared with the input signal to produce a corrective or difference signal which is applied to the integrator 12 and thence to direct-coupled amplifier 11. The output of the integrator is representative of the D.C. component of the applied input signal and of drift of the amplifier 11. In the present embodiment, the selected fractions of the output signal and the input signal, in the form of currents, are fed into point $P_1$ in the input of the amplifier system 10. During steady-state conditions, due to the current of the input signal being equal to the selected fractional current of the output, zero current flows from point $P_1$. Under this stable condition the continued output of the integrator 12 maintains the output of the D.C. amplifier 11.

The D.C. amplifier 11 is illustrated as having two outputs. These outputs, one represented by the terminals 65, 65a, and the other represented by terminals 66, 66a, are respectively representative of uncompensated and compensated outputs. During initial conditions with the D.C. amplifier 11, having a finite rather than an infinite gain, the response of the amplifier to a step input may not be in full measure. The output of the amplifier will not be equal to the input signal times the prescribed gain of the amplifier. The discrepancy may be due to several factors, among them being a voltage drop across the transformer primary and current being drawn through paths other than the feedback resistor 63. For all practical purposes, however, with an amplifier having a very large gain and/or a very large loop gain, the desired relationship between the input and the output signals will be substantially attained without need for compensation.

However, there may be instances where compensation may be desired, in which case a compensating network 67 can be added in the output of the D.C. amplifier 11. The compensating network 67 is shown to include in series with an output resistor 68 a pair of series resistors 69 and 70 respectively shunted by capacitors 71 and 72. During steady-state conditions, i.e., direct current flowing, the network 67 acts as a voltage-divider, the capacitors 71 and 72 being effectively open circuits around their associated resistors. Hence, the output voltage is determined by the following ratio:

$$\frac{R_{68}}{R_{68}+R_{69}+R_{70}} \qquad (21)$$

where $R_{68}$, $R_{69}$ and $R_{70}$ are respectively the resistance values of resistors 68, 69 and 70.

Upon the cessation of the steady-state condition, as when a current change, such as a step function, appears at the input to the direct-coupled amplifier 11, the capacitors 71 and 72 will effectively short-circuit their associated resistors 69 and 70. The compensating network then reduces to the single resistor 68 and the output signal is materially increased, as represented by the ratio:

$$\frac{(R_{68})}{(R_{68})}=1 \qquad (22)$$

Upon the attainment of the inflection point of the step function and continuing direct current, resulting in a substantially direct-current output from the amplifier 11, the ratio of the resistors comprising compensating network reverts to the initial form set forth above in Equation 21.

With the above principles of the invention in mind, it will, of course, be understood that those skilled in the art may now make further modifications without departing from the invention as set forth in the appended claims.

What is claimed is:

1. A wide-band amplifying system adapted to have a system input signal applied to an input circuit thereof for producing in an output circuit an amplified system output signal, comprising negative feedback means including voltage-dividing components connected between said system input circuit and said system output circuit, a step-up transformer having a primary circuit and a secondary circuit, means connecting said primary circuit between said system input circuit and said negative feedback means for applying to said primary circuit said system input signal modified by action of said negative feedback means, a direct-coupled amplifier coupled to said secondary circuit for application to that amplifier of the alternating component of said system input signal for producing in said system output circuit the amplified alternating componet of said system input signal, a converting circuit connected between said system input circuit and said negative feedback means for application to said converting circuit of a difference signal representative of the difference between said system input signal and said system output signal divided by the system gain, said difference signal including the direct-current component of said system input signal and an error signal proportional to zero drift of said direct-coupled amplifier, said converting circuit including converter means for converting said difference signal to an alternating signal of frequency determined by said converting means, a non-conductively coupled amplifier having its input coupled to said converter means for amplifying said alternating signal, and means coupled to the output of said non-conductively coupled amplifier and also coupled to said direct-coupled amplifier for applying to said direct-coupled amplifier a signal which produces in the output of said direct-coupled amplifier and in said system output circuit the amplified direct-current component of said system input signal and for correcting the output of said direct-coupled amplifier in the event of zero drift of that amplifier.

2. The amplifier system of claim 1 in which there is provided an integrating means including said non-conductively coupled amplifier and having a delay time which introduces a time delay in the development in said output circuit of the amplified direct-current component of said system input signal and in which said transformer has an actual time constant of a length exceeding the delay time of said integrating means.

3. The amplifying system of claim 1 in which said negative feedback means includes two sets of voltage-dividing components from one of which sets is derived said difference signal and from the other of which sets is derived said system input signal modified by a negative feedback signal approaching, but of slightly less amplitude than, the system output signal divided by the gain of the system.

4. The amplifier system of claim 1 in which there is provided an integrating means including said non-conductively coupled amplifier and in which there is provided in the input circuit of said integrating means a compensatory means for reducing attenuation in the system output signal resulting from a change in the magnitude of the system input signal by producing a signal in time anticipatory of the attenuation.

5. The amplifier system of claim 3 in which said compensatory means is comprised of a resistor and a capacitor in parallel serially connected to a parallel-connected resistor and inductor and in which said non-conductively coupled amplifier has its input connected at the junction of said capacitor and said inductor.

6. The amplifier system of claim 1 in which said direct-coupled amplifier includes in its output a compensatory circuit comprised of at least one capacitor and one resistor in parallel circuit arrangement and in series with a second resistor, said system output circuit being connected across said second resistor.

7. The amplifying system of claim 1 in which said system-input signal is an electric current and said negative feedback means is a direct-coupled current feedback circuit.

8. The amplifying system of claim 1 in which there is additionally included a resistor in series in the primary circuit of said transformer for avoiding a short circuit across said converting circuit for signals of very low frequency.

9. An amplifying system adapted to have a system input signal applied thereto, comprising a direct-coupled amplifier, negative feedback means coupled to the output of said direct-coupled amplifier for deriving from the output thereof signal potentials one of which has an amplitude equal to the output signal of said direct-coupled amplifier divided by the gain thereof and the second of which has an amplitude slightly less than the magnitude of said first signal potential, a coupling transformer having a primary circuit and a secondary circuit, said secondary circuit being connected to apply an alternating signal to the input of said direct-coupled amplifier, means including said primary circuit of said transformer for comparing said system input signal with said second of said signal potentials for producing a difference signal in said primary circuit for developing said alternating signal in said secondary circuit and for excluding therefrom the direct-current component of said system input signal, a non-conductively coupled amplifier, means for comparing said system input signal with said first of said signal potentials to obtain a second difference potential including the direct-current component of said system input signal, means for converting said second difference signal to a second alternating signal, circuit means for applying said second alternating signal to the input of said non-conductively coupled amplifier, a rectifier connected to the output of said non-conductively coupled amplifier for producing a direct-current output potential, and means for applying said direct-current output potential to said direct-coupled amplifier for producing in the output of that amplifier the amplified direct-current component of said system input signal and for correcting the output of said direct-coupled amplifier upon the occurrence of zero drift during operation of said direct-coupled amplifier.

10. A wide-band amplifier system adapted to have a system input signal applied thereto, comprising a direct-coupled amplifier having input and output circuits, a signal-multiplying transformer having its primary circuit connected to receive said system input signal and having its secondary circuit forming at least a part of said input circuit of said direct-coupled amplifier for applying to said direct-coupled amplifier only the alternating-current component of said input signal, means coupled to said output circuit of said direct-coupled amplifier for producing a signal representative of the output signal of said direct-coupled amplifier divided by the gain of the system, means coupled to said primary circuit of said transformer for comparing the system input signal with said produced signal to provide a difference signal including the direct-current component of the system input signal, means for integrating said difference signal for producing an output signal including a component representative of the direct-current component of said system input signal, and means for connecting said output of said integrating means in series circuit relation in said input circuit including as part of said input circuit said secondary circuit of said transformer.

References Cited in the file of this patent

UNITED STATES PATENTS

| | | |
|---|---|---|
| 2,619,552 | Kerns | Nov. 25, 1952 |
| 2,684,999 | Goldberg et al. | July 27, 1954 |
| 2,709,205 | Colls | May 24, 1955 |
| 2,714,136 | Greenwood | July 26, 1955 |
| 2,744,168 | Gilbert | May 1, 1956 |
| 2,744,969 | Peterson | May 8, 1956 |

FOREIGN PATENTS

| | | |
|---|---|---|
| 620,140 | Great Britain | Mar. 21, 1949 |
| 670,801 | Great Britain | Apr. 23, 1952 |